United States Patent [19]

Hsieh

[11] 4,180,775
[45] Dec. 25, 1979

[54] MAGNETIC THIN-FILM SPLIT-DOMAIN CURRENT SENSOR-RECORDER

[75] Inventor: Edmund J. Hsieh, Livermore, Calif.

[73] Assignee: The United States of America as represented by the United States Department of Energy, Washington, D.C.

[21] Appl. No.: 778,275

[22] Filed: Mar. 16, 1977

[51] Int. Cl.² .................... G01R 33/02; G01R 19/04
[52] U.S. Cl. .................................. 324/249; 324/102; 324/117 R
[58] Field of Search ................... 324/249, 102, 117 R

[56] References Cited

PUBLICATIONS

Matsushita et al.; Magneto optical Ammeter; IEEE Trans. on Mag.; vol. Mag.-6; No. 3; Sep. 1970; pp. 569-571.
Irons et al.; Fast Transient Recorder Using Magnetic Thin Films; Rev. of Scien. Inst. vol. 41, No. 10; Oct. 1970; pp. 1451-1456.
Hsieh et al., A Simple Method for Determining the Uniaxial Aniso. Dir. & Skew etc.; IEEE Trans. on Mag. vol. Mag. -7; No. 4; Dec. 1971; p. 910-911.
Wichner et al.; A Magnetic Thin Film etc.; Nuclear Science; vol. NS-19; No. 1; Feb. 1972; pp. 469-474.
Hsieh et al.; Measurement of Radiation Induced Transients etc., USERDA Report No. UCID—17269; Sep. 21, 1976; pp. 1-19.

Primary Examiner—Robert J. Corcoran
Attorney, Agent, or Firm—Dean E. Carlson; R. S. Gaither; Clifton E. Clouse, Jr.

[57] ABSTRACT

A sensor-recorder for recording a representation of the direction and peak amplitude of a transient current. A magnetic thin film is coated on a glass substrate under the influence of a magnetic field so that the finished film is magnetically uniaxial and anisotropic. The film is split into two oppositely magnetized contiguous domains with a central boundary by subjecting adjacent portions of the film simultaneously to magnetic fields that are opposed 180°. With the split-domain sensor-recorder placed with the film plane and domain boundary either perpendicular or parallel to the expected conductive path of a transient current, the occurrence of the transient causes switching of a portion of one domain to the direction of the other domain. The amount of the switched domain portion is indicative of the amplitude of the peak current of the transient, while the particular domain that is switched is indicative of the direction of the current. The resulting domain patterns may be read with a passive magnetic tape viewer.

12 Claims, 9 Drawing Figures

MAGNETIC THIN-FILM SPLIT-DOMAIN CURRENT SENSOR-RECORDER

The invention disclosed herein was made under, or in, the course of Contract No. W-7405-ENG-48 with the United States Energy Research and Development Administration.

BACKGROUND OF THE INVENTION

The present invention relates to magnetic thin films as sensor-recorders of transient electrical currents, and more particularly it relates to a thin film premagnetized into two oppositely magnetized domains for recording the direction and peak amplitude of a transient current.

In gathering data for the analysis of conditions created during an actual nuclear event, it is desirable to know the character of fast electrical transients at various locations in the vicinity of the event. To sense and record such transients it is necessary therefore to provide sensors and recorders that are not affected by nuclear radiation. In the past this has been accomplished by use of magnetic thin films such as described in the prior art by Wichner et al in "A Magnetic Thin-Film Recording System for Fast Transients in Nuclear Diagnostics," *Nuclear Science*, Volume NS-19, Number 1, February 1972, pages 469–474, and by Hsieh et al in "Radiation Hardness of A New Magnetic Thin-Film Recording System," *Nuclear Science*, Volume NS-18, Number 1, February 1971, pages 224–227. However, the films described in this prior art are single domains prior to using them for sensing and recording a transient current. The second domains in the prior art are created during the recording of a transient current and require complex electronic equipment or magneto-optic apparatus in order to read out any information recorded on the film. Such equipment and apparatus is not conveniently adaptable for use in the field since it is unwieldy to carry to the locations at which the films are placed. Alternatively, it is also cumbersome to collect the films and transport them to a central location for analysis. Moreover, if it is necessary for the purpose of the analysis to know the direction of the transient currents, two single-domain films are required. This can be a serious problem where there is limited space.

SUMMARY OF THE INVENTION

In brief, the present invention is a passive current sensor and recorder, including a planar substrate and a uniaxial anisotropic magnetic thin film on the substrate with the magnetic film having a first portion initially magnetized in a first direction and a second portion initially magnetized in a second direction that is 180° opposite but coaxial to the first direction, the magnetic film thereby being in the form of split domains prior to recording a current amplitude so that the film is responsive to a current perpendicular to its plane to switch one of the domains to the direction of the magnetic field of the current in an amount that is proportional to the peak amplitude of the current. The domains may be originally set and thereafter reset to their opposite directions by means of induced magnetic fields.

It is an object of the invention to improve and simplify the sensing and recording of fast electrical transients.

Another object is to provide a small, stable, radiation hard magnetic thin-film sensor on which a representation of the peak amplitude and direction of a transient current may be recorded with improved distinction and retention.

Another object is to conveniently and simply measure transient currents in radioactive environments, standing wave currents such as on antennas, induced currents in aircraft, and lightning surges by means of passive devices only.

Another object is to sense, record, readout and reset magnetic thin-film transient current sensor-recorders at the location at which they are used.

Other objects and advantageous features of the invention will be apparent in a description of a specific embodiment thereof, given by way of example only, to enable one skilled in the art to readily practice the invention which is described hereinafter with reference to the accompanying drawing.

DESCRIPTION OF AN EMBODIMENT

Figure 1:
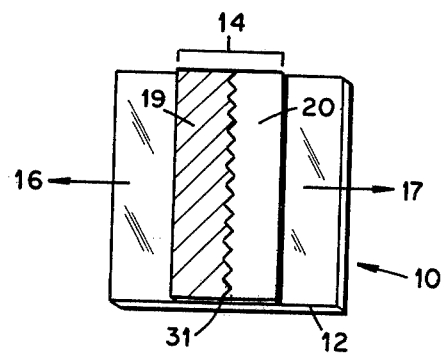
FIG. 1 is a plan view of a magnetic thin-film split-domain sensor-recorder, according to the invention.
Figure 2:
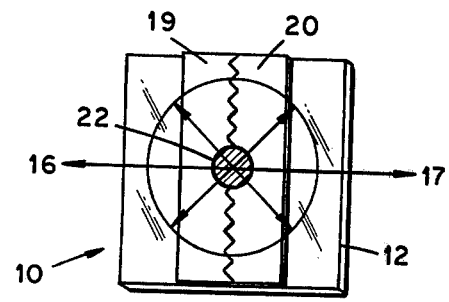
FIG. 2 shows the sensor-recorder of FIG. 1 being subjected to the field of a rod magnet to orient the magnetic thin-film into two domains.
Figure 3:
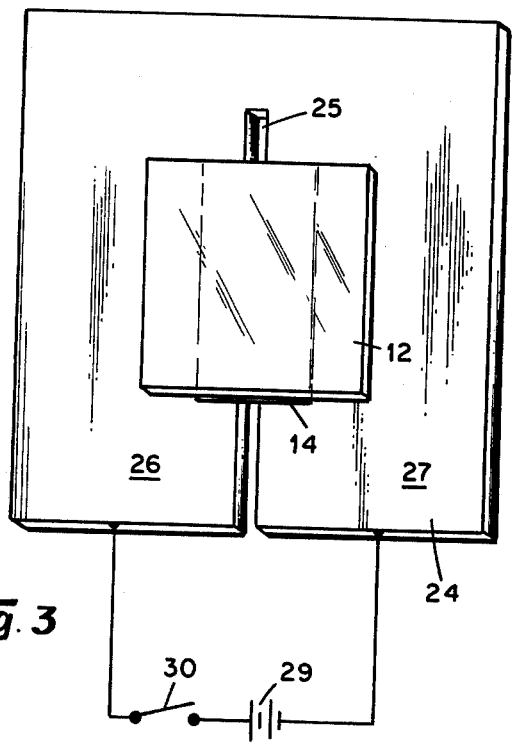
FIG. 3 shows the sensor-recorder of FIG. 1 being subjected to the field of a u-shaped current conductor to orient the magnetic thin-film into two domains.

Referring to the drawing there is shown in FIG. 1 a sensor-recorder 10, according to the invention, including a substrate 12 of a material such as glass with a uniaxial anisotropic magnetic thin film 14 coated over a portion of the substrate. The film 14 may be a nickel-iron alloy such as Permalloy and may be deposited on the substrate by means of any one of various well-known vapor deposition techniques such as for example one of the techniques used in the manufacture of magnetic thin-film memories. During such deposition, a magnetic field is applied in either a direction 16 or direction 17 so that the completed film is a single magnetic domain in either direction 16 or 17 after the applied magnetic field is removed. A characteristic of a film deposited in this way is that the direction of the domain of any portion of the film may be easily switched 180° by subjecting that portion temporarily to a magnetic field in the direction to be switched. The next step in the preparation of the sensor-recorder 10 is to orient the film 14 into two magnetic domains 19 and 20. This may be accomplished by passing one end of a rod magnet 22 (FIG. 2) centrally over the length of the film 14 whereupon the domains 19 and 20 are formed with magnetic orientations in opposite but coaxial directions 16 and 17. Alternatively, the domains may be formed by means of an electrically conductive plate 24 (FIG. 3) having a slit 25 cut over part of its length to form two legs 26 and 27 connected at one end and separated at the other. A voltage source 29 in series with a switch 30 is connected across the separated ends of the legs 26 and 27 and the sensor-recorder 12 is laid against the legs with the slit 25 centrally aligned with the length of the film. Momentary closure of the switch 30 causes an electric current to flow in the legs 26 and 27. Since the current is in an opposite direction in each leg, the magnetic field associated with each leg is opposed to that in the other. The field around each leg switches the adjacent portion of magnetic film 14 to thereby form the film into the domains 19 and 20 in opposite directions with a central boundary 31.

Figure 4:
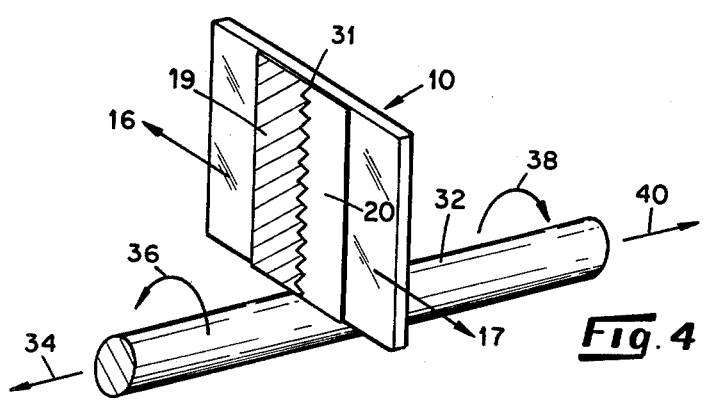
FIG. 4 shows the sensor-recorder of FIG. 1 in place adjacent a current conductor for recording the direction and peak amplitude of a transient current in the conductor.
Figure 5:
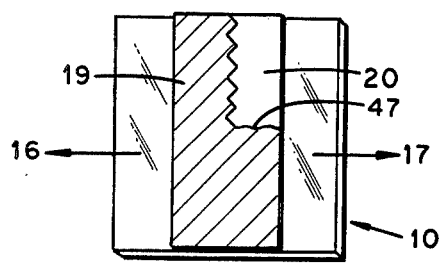
FIG. 5 shows the orientation of the domains of the sensor-recorder of FIG. 1 after recording a current in a first direction through the conductor of FIG. 4.
Figure 6:
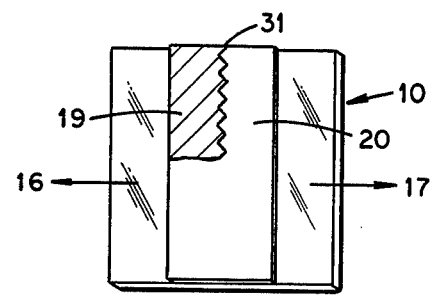
FIG. 6 shows the orientation of the domains of the sensor-recorder of FIG. 1 after recording a current in a second direction through the conductor of FIG. 4.
Figure 7:
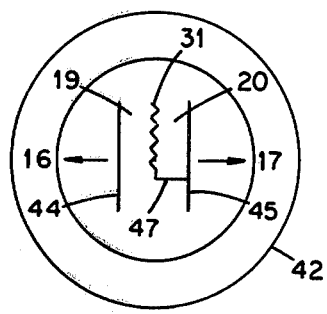
FIG. 7 is a diagrammatic view of a passive magnetic tape viewer for reading the orientation of the domains of the sensor-recorder of FIG. 1.

To sense and record the direction and peak amplitude of a transient current such as in an electrical conductor 32 (FIG. 4) by means of the sensor-recorder 10, the sensor-recorder is placed adjacent the conductor with the boundary 31 between the domains 19 and 20 and the plane of the film 14 aligned perpendicularly and transversely to the axis of the conductor. Upon the occurrence of a transient current in the conductor 32, the magnetic field associated with the current will be in opposition to one or the other of the domains 19 or 20 and causes the opposing domain to switch its direction 180°. The amount of the domain that is switched is proportional to the peak of the amplitude of the current. For example, with the domains 19 and 20 oriented in the direction 16 and 17 respectively, and a transient current in the conductor 32 in the direction 34, the magnetic field associated with the current is in the direction 36 and has a strong component in the direction 16 which causes switching of a portion of the domain 20 from the direction 17 to the direction 16. In FIG. 5 a representative lower portion of the domain 20 is shown switched to the direction 16 such as would be done by a field in the direction 36; and in FIG. 6, a representative lower portion of the domain 19 is shown switched to the direction 17 such as would be done by a field in the direction 38 due to a transient current in the conductor 32 in the direction 40. A representation of the direction and peak amplitude of a transient current in the conductor 32 is thereby recorded on the sensor-recorder 10. The recording may be read by means of a Kerr magneto-optic system; however, the recording is so clearly made that it may be read with a passive magnetic tape viewer 42 (FIG. 7) of the Suchow powder type such as available from the 3M Company, Saint Paul, Minn. The outer boundaries of the film 14 in the directions 16 and 17 show up as vertical lines 44 and 45 while the central boundary 31 appears partially obliterated and replaced with a boundary 47 transverse to the central boundary. The boundary 47 is formed at a location from the film edge adjacent the conductor that is proportional to the current and in the direction of the field of the current. It should be noted that a threshold field, the coercive field of the magnetic film, is required before switching of a domain commences. The threshold field level is an intrinsic property of the film material.

Figure 8:
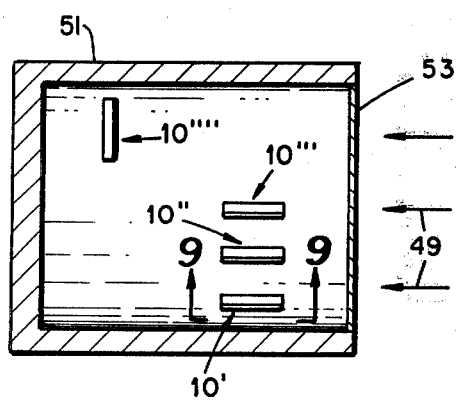
FIG. 8 shows a plurality of the sensor-recorders of FIG. 1 mounted within a cylinder shown in longitudinal cross section in the path of a field of radioactivity for recording the direction and peak amplitude of the magnetic field associated with a Compton-electron ion current induced by the radioactive field.
Figure 9:
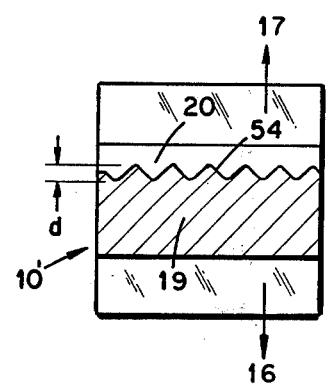
FIG. 9 is a view of a sensor-recorder of FIG. 8 taken along lines 9—9 showing the orientation of the sensor-recorder within the cylinder.

A particular use of the invention is for determining the level of activity of a radioactive field 49 (FIG. 8) at a specific location in the vicinity of a nuclear event. This may be accomplished by mounting sensor-recorders 10', 10", and 10''' within a cylinder 51 of magnetic material with the boundaries 31 of the sensor-recorders parallel to the axis of the cylinder and with the axis of the cylinder generally aligned with the field 49. The cylinder 51 is provided with a cover 53 on the end of the cylinder towards the radiation. The cover 51 is made of magnetic material to complete magnetic shielding of the sensor-recorders from the diverse random magnetic fields associated with a nuclear event. However, the shield is made sufficiently thin as to be virtually transparent to the radioactive field 49 to thereby permit Compton electrons to be produced by the interaction of the field 49 with the free electrons in the cover 53. These electrons pass into the interior of the cylinder 51 and are forced by the cylinder to traverse paths generally parallel to the axis of the cylinder. The Compton electrons constitute an electric current with a magnetic field concentric with the axis of the cylinder. The magnetic field is maximum at the inner circumference of the cylinder and minimum along the central axis of the cylinder. The magnetic field influences the sensor-recorders 10', 10" and 10''' to cause movement of the boundary of the domains from the central position to a position in the direction 17 in proportion to the intensity and time period of the Compton-electron magnetic field. A representative movement a distance d (FIG. 9) from the central position of the boundary to a position 54 is proportional to the intensity and time period of the applied Compton electron field at the particular location within the cylinder and therefore to the intensity and time period of the applied radioactive field 49. Alternatively, a sensor-recorder 10'''' (FIG. 8) may be mounted with the central boundary between the domains aligned along a diameter of the cylinder. In this case the movement of the domain boundary is to a position transverse to the original central boundary, similar to the boundary 47 (FIG. 5).

In specific use of the invention, glass substrates were vapor coated with a nickel-ferrite material to a thickness of 300–800 angstroms in the presence of a steady magnetic field of 20 oersteds. The coated areas of the substrates were 3.5 cm×3 mm and 3 mm×3 mm. Split domains were formed in the films and the resulting smaller sensor-recorders were mounted adjacent input-output leads on microcircuit boards for measuring the peak amplitude and direction of induced currents in the leads, and the larger sensor-recorders were mounted in a cylinder of magnetic material for measuring the intensity of a radioactive field. The microcircuit board and cylinder with the sensor-recorders were placed in the path of radiation from a nuclear event. The direction and peak amplitude of the resulting induced currents were successfully recorded on the sensor-recorders with a useful degree of sensitivity. For a more complete discussion of the results reference is made to United States Energy Research and Development Administration technical report No. UCID-17269, *Measurement of Radiation Induced Transients In Hybrid Microcircuits By Magnetic Thin Film Sensor/Recorders*, by Hsieh, Vindelov, Brown, and Miller, Lawrence Livermore Laboratory, Livermore, Calif.

It is anticipated that the invention also will find other uses such as for measuring transient currents induced by lightning and in exploding bridgewire experiments.

While an embodiment of the invention has been shown and described, further embodiments or combinations of the invention will be apparent to those skilled in the art without departing from the spirit of the invention.

What I claim is:

1. A passive nuclear-radiation hard current sensing and recording system including a magnetic thin film split-domain sensor-recorder, said system comprising:
    a current path;
    a substrate; and
    a uniaxial anisotropic magnetic thin film on said substrate, said film having first and second opposing pairs of outer edges, said film including a first portion initially magnetized in a first direction to form a first domain and a second portion initially magnetized in a second direction to form a second domain, said first and second differently magnetized domains having contiguous interior edges forming an initial magnetic boundary in a predetermined location that is parallel to said second pair of edges, said film being oriented with one edge of said first opposing pair of outer edges adjacent said current path, said domains being formed prior to placement of said film adjacent said current path, said domains and boundary being movable in response to the magnetic field of an electric current along said current path to a second location representative of the peak strength and direction of the field and therefore of the peak amplitude and direction of the current, one of said domains, being at least partially switched during the boundary movement so that at least a portion of said film is magnetically uniform between said second pair of edges, said uniformity extending from said one outer edge adjacent said current path towards the opposite edge of said first edge pair a distance that is proportional to the peak strength of the current.

2. The sensing and recording system of claim 1, wherein said film has an easy axis and a hard axis, said hard axis being perpendicular to said easy axis, said first and second directions of magnetization being coaxial with said easy axis.

3. The sensing and recording system of claim 2, wherein said thin film is an alloy of nickel and iron deposited on said substrate in the presence of a magnetic field in the direction of said easy axis.

4. The sensing and recording system of claim 1, wherein said sensor-recorder is mounted with said thin film and initial boundary perpendicular and transverse to the path of the electric current, and said second location of the moved portion of said boundary is parallel to the exterior edge adjacent said current path and perpendicular to said initial boundary.

5. A passive method for sensing and recording the peak amplitude and direction of the magnetic field of an electric current along a current path by means of a uniaxial anisotropic magnetic thin film including the steps of:
    magnetizing a first portion of said film initially in a first direction to form a first magnetic domain and magnetizing a second portion initially in a second direction to form a second magnetic domain, said first and second differently magnetized domains having a mutually contiguous interior edge to form an initial magnetic boundary in a predetermined location, said film having first and second pairs of opposing outer edges, said boundary being parallel to said second pair of edges; and
    placing said film adjacent said electric current path, said film being oriented with one edge of said first opposing pair of outer edges adjacent said current path, said resulting domains by said initial magnetization being formed prior to placement of said film adjacent said current path, said domains being alterable to move at least a portion of said boundary in response to the occurrence of the magnetic field of said electric current along said path, the position of said altered portion of said boundary being representative of the peak amplitude and direction of the electric current, one of said domains being at least partially switched during boundary movement so that at least a portion of said film is magnetically uniform between said second pair of edges, said uniformity extending from said one outer edge adjacent said current path towards the opposite edge of said first edge pair a distance proportional to the peak strength of the current.

6. The method of claim 5, wherein said film is an alloy of nickel and iron and the method further includes the step of evaporation of the alloy onto a glass substrate under the influence of a magnetic field.

7. The method of claim 5, further including the step of placing the film under a passive magnetic tape viewer for visually observing the location of the boundary between said domains.

8. The method of claim 5, wherein said step of magnetizing said domains prior to placing said film includes: placing the film on an electrically conductive plate having a narrow slit over part of its length, thereby forming two legs connected at one end and separated at the other, said film being placed over said slit; and applying a voltage across the legs to cause a current to flow therethrough for creating a pair of magnetic fields in opposite directions for magnetizing the film into said first and second domains with a boundary coincident with said slit.

9. The method of claim 5, wherein said step of magnetizing said film to form two domains prior to placing said film includes moving one end of a rod magnet along a straight line adjacent the surface of the film, said film thereby being magnetized in opposite directions on opposite sides of said line, said boundary between the domains being formed coincident with the line of movement of said magnet.

10. The method of claim 5, wherein said step of placing the film includes placement of the film and said initial magnetic boundary perpendicular and transverse to the path of the electric current, said altered portion of said boundary being parallel to the exterior edge adjacent said current path and perpendicular to said initial boundary.

11. A passive nuclear radiation hard current sensing and recording system including a magnetic thin film split-domain sensor-recorder, said system comprising:
    a current path;
    a substrate; and
    a uniaxial anisotropic magnetic thin film on said substrate, said film having first and second opposing pairs of outer edges, said film including a first portion initially magnetized in a first direction to form a first domain and a second portion initially magnetized in a second direction to form a second domain, said first and second differently magnetized domains having contiguous interior edges forming an initial magnetic boundary in a predetermined location that is parallel to said second pair of edges, said film being placed with said second opposing pair of outer edges adjacent and parallel to said current path, said domains being formed prior to placement of said film, said domains and boundary being movable in response to the magnetic field of an electric current along said current path to a second location representative of the peak strength and direction of the field and therefore of the peak amplitude and direction of the current, one of said domains being at least partially switched during the boundary movement so that the boundary is moved towards one of said opposite edges of said second edge pair a distance that is proportional to the peak strength of the current.

12. A passive method for sensing and recording the peak amplitude and direction of the magnetic field of an electric current along a current path by means of an uniaxial anisotropic magnetic thin film including the steps of:

magnetizing a first portion of said film initially in a first direction to form a first magnetic domain and magnetizing a second portion initially in a second direction to form a second magnetic domain, said first and second differently magnetized domains having a mutually contiguous interior edge to form an initial magnetic boundary in a predetermined location, said film having first and second pairs of opposing outer edges, said boundary being parallel to said second pair of edges; and placing said film adjacent said electric current path, said film being oriented with one edge of said second opposing pair of puter edges parallel to said current path, said resulting domains by said initial magnetization being formed prior to placement of said film adjacent said current path, said domains being alterable to move at least a portion of said boundary in response to the occurrence of the magnetic field of said electric current along said path, the position of said altered portion of said boundary being representative of the peak amplitude and direction of the electric current, one of said domains being at least partially switched during boundary movement so that the boundary is moved towards the opposite edge of said second edge pair a distance proportional to the peak strength of the current.

* * * * *